(12) United States Patent
D'Souza et al.

(10) Patent No.: US 8,192,564 B2
(45) Date of Patent: Jun. 5, 2012

(54) METAL CASTING

(75) Inventors: Neil J D'Souza, Derby (GB); Paul A Withey, Derby (GB); Hongbiao Dong, Oxford (GB); Huijuan Dai, Leicester (GB)

(73) Assignee: Rolls-Royce PLC, London (GB)

( * ) Notice: Subject to any disclaimer, the term of this patent is extended or adjusted under 35 U.S.C. 154(b) by 468 days.

(21) Appl. No.: 12/457,752

(22) Filed: Jun. 19, 2009

(65) Prior Publication Data
US 2010/0012231 A1    Jan. 21, 2010

(30) Foreign Application Priority Data
Jul. 18, 2008    (GB) .................................. 0813112.0

(51) Int. Cl.
*C22F 1/10*    (2006.01)
*B22D 46/00*    (2006.01)

(52) U.S. Cl. ...................................... 148/555; 148/538
(58) Field of Classification Search .................. 148/538, 148/555
See application file for complete search history.

(56) References Cited

U.S. PATENT DOCUMENTS
5,404,930 A    4/1995    Stanton et al.

FOREIGN PATENT DOCUMENTS
RU    2 299 784 C1    5/2007

*Primary Examiner* — Jessee R. Roe
(74) *Attorney, Agent, or Firm* — Oliff & Berridge, PLC

(57) ABSTRACT

A method of growing a single crystal seed bar (10) in which a mold provided with a grain selector filter (16) above a starter chamber is filled with molten metal, whereupon the metal is allowed to solidify slowly upwardly from the starter chamber. The filter (16) is provided with a pattern of openings, with the diameter of the openings being at least as large as the primary dendrite tip radius of the metal, but smaller than half the primary dendrite arm spacing.

14 Claims, 2 Drawing Sheets

METAL CASTING

BACKGROUND

This invention concerns a method of growing single crystal metal seed bars, and also a method of casting an item, and particularly but not exclusively casting a turbine blade for a gas turbine engine.

Single crystal casting of metals is used in a number of applications, for instance producing items such as turbine blades for gas turbine engines. For some such articles the crystal orientation in the blades can be quite significant, and hence the use of single crystal casting.

Conventionally a spiral helix grain selector is used to select a single grain. A spiral is also used to eliminate stray grains nucleated at the seed melt-back which could subsequently grow competitively with the primary single crystal. Using a spiral helix involves a number of operations and may provide difficulties in seed to blade alignment in products such as turbine blades. Also when using spiral helixes, spiral cracking can occur during de-waxing operations. Also when using spiral helixes stray grains can nucleate within the spiral because of local front curvature.

SUMMARY

According to the present invention there is provided a method of growing a single crystal seed bar, the method including providing a mould with a grain selector filter above a starter chamber, filling the mould with molten metal, and allowing the metal to solidify slowly upwardly from the starter chamber, the filter having a pattern of openings, with the diameter of each of the openings being at least as large as the primary dendrite tip radius of the metal, but smaller than half the primary dendrite arm spacing.

The filter may have a hexagonal pattern of openings.

The diameter of each of the openings in the filter may be less than 150 µm, may be less than 100 µm, may be less than 50 µm, and may be in the range 5-20 µm.

The filter may be less than 3 mm thick and may be less than 1.5 mm thick.

A helical pattern selector may be provided beneath the grain selector filter.

The mould may be filled at upper and lower locations.

The metal may be a nickel based alloy.

The mould may be heated in a furnace, and the metal may be allowed to solidify by moving the mould slowly out of the furnace.

The invention further provides a method of casting an item, the method including providing a mould with a starter chamber and a moulding chamber of a required shape thereabove, locating a seed bar made by a method according to any of the preceding eight paragraphs in the starter chamber, heating the mould, but not so as to fully melt the seed bar, supplying molten metal into the mould and allowing the metal to solidify slowly upwardly from the seed bar.

A grain selector filter according to any of said preceding eight paragraphs may be provided in the mould above the starter chamber.

The mould may be heated in a furnace, and the metal may be allowed to solidify by moving the mould slowly out of the furnace.

BRIEF DESCRIPTION OF THE DRAWINGS

Embodiments of the present invention will now be described by way of example only and with reference to the accompanying drawings, in which.

DETAILED DESCRIPTION OF EMBODIMENTS

Figure 1:
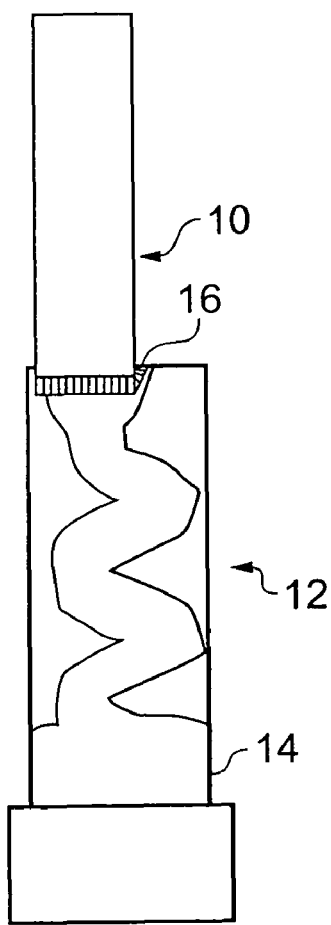
FIG. 1 is a diagrammatic view of apparatus for producing a seed bar according to the invention.

FIG. 1 diagrammatically shows a seed bar 10 being formed according to the invention. Here a conventional spiral helix grain selector 12 with top and bottom filling is being used to select a single grain from a multitude of grains in a starter block 14 of a nickel based alloy. As the spiral selector 12 is of a conventional design it will not be described in any further detail.

Figure 7:
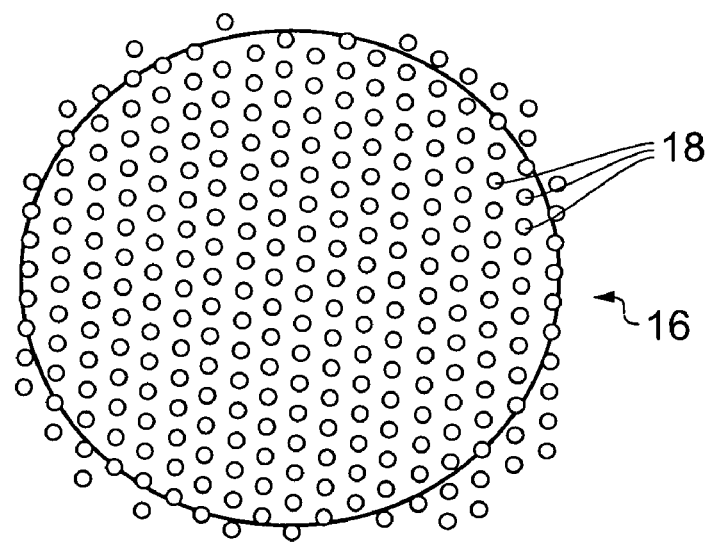
FIG. 7 is a diagrammatic plan view of part of the apparatus of FIG. 1.

Located immediately above the spiral selector 12 is a grain selector filter 16 as shown in FIG. 7. The grain selector 16 has a hexagonal pattern of openings 18 which extend therethrough. The openings are of a size to be at least as large as the primary dendrite tip radius of the metal, but smaller than half the primary dendrite arm spacing. In practice this means that the openings 18 have a diameter of between 5 and 150 µm dependent on the particular alloy. The selector 16 is made of ceramics, and the openings 18 can be preformed, or subsequently formed by drilling.

In use of the apparatus of FIG. 1, the apparatus will initially be located in a furnace to ensure the metal is molten. The apparatus is slowly drawn out of the furnace providing for solidifying of the metal. The apparatus, and particularly in view of the selector 16, produces a single crystal seed with a close packed dendritic structure which thus minimises local undercooling. The selector 16 only enables dendrites that conform to the hexagonal pattern of openings 18 to grow through the perforations. This arrangement provides an advantage over seed bars grown using just a standard wax spiral, in that the close packed primary dendrite structure is retained over the whole solidification length.

Figure 2:
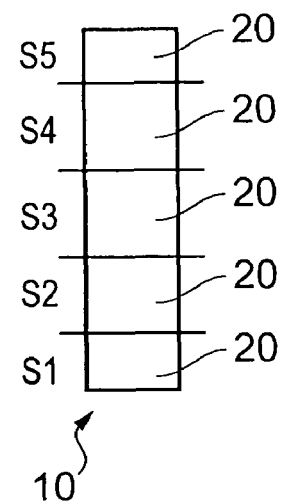
FIG. 2 is a diagrammatic seed bar made by the apparatus of FIG. 1.
Figure 3:
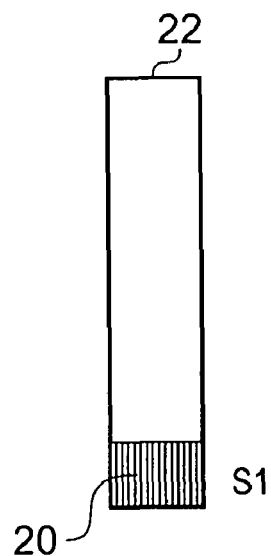
FIG. 3 is a diagrammatic view of a further seed bar being made by a method according to the invention.

The seed bar 10 thus formed is illustrated in FIG. 2 and can be cut for instance into five portions 20. Such portions 20 can be used to produce a further seed bar as shown diagrammatically in FIG. 3. Here a mould is provided with a starter chamber and a chamber above. The portion 20 is located in the starter chamber. The mould is heated but such that the portion 20 does not fully melt.

Figure 4:
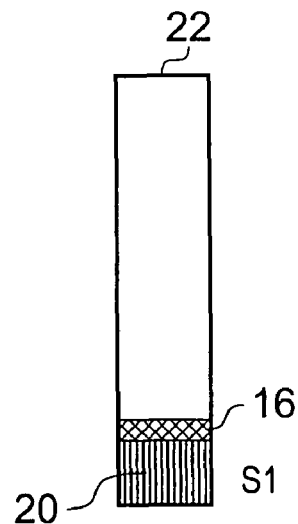
FIG. 4 is a further diagrammatic view of a seed bar being made by a method according to the invention.

Liquid metal is introduced into the mould chamber and also starter chamber. The mould is slowly withdrawn from a furnace to permit a new seed bar 22 to be formed. The close pack structure of the seed portion 20 means that it is not necessary to use the spiral selector. The hexagonal packing suppresses nucleation of stray grains at the melt-back because of diminished undercooling. Whilst in FIG. 3 no grain selector 16 is required, at times it may be necessary to use a grain selector 16, and such an arrangement is shown in FIG. 4.

Figure 5:
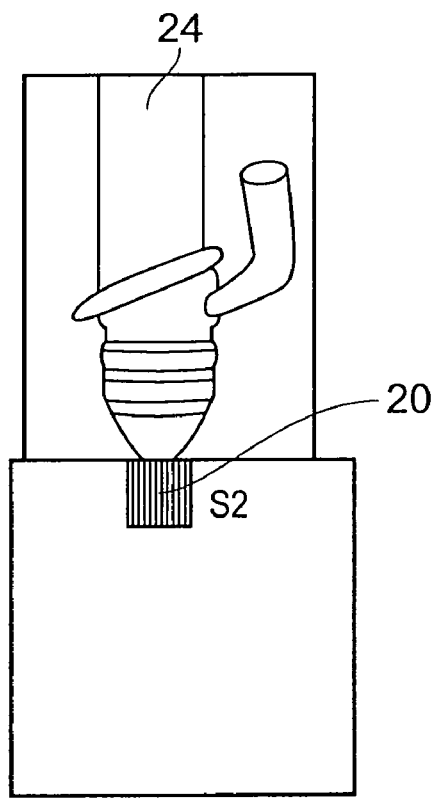
FIG. 5 is a diagrammatic side view of a turbine blade being made by a method according to the invention.
Figure 6:
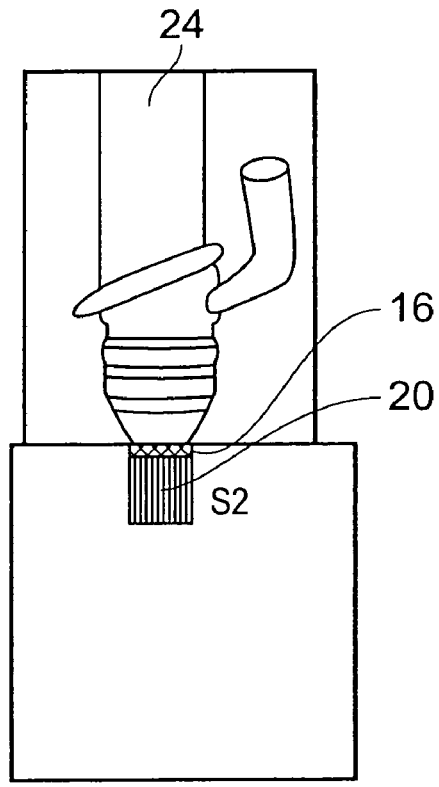
FIG. 6 is a similar view to FIG. 5 but for using a modified method according to the invention.

FIG. 5 diagrammatically shows the formation of a turbine blade 24. Here apparatus similar to that described for FIG. 3 above is used, but with an appropriately shaped mould chamber. Here again molten metal is provided into the mould chamber and the starter chamber, the latter of which locates the portion 20. Again the portion 20 is not permitted to fully melt, and upon gradual cooling the metal solidifies to form the turbine blade 24. FIG. 6 shows a similar arrangement to FIG. 5 but where a grain selector 16 is used.

There is thus described a method of growing seed bars, and also a method of forming further seed bars and items such as turbine blades from such seed bars which provide for a number of advantages. It is only necessary to use the spiral ground selector to produce the initial seed bar. Thereafter further seed bars and shaped items can be produced, using a grain selector filter when necessary. As indicated, the seed bars produced tend to have a more consistent quality along their length.

Various modifications may be made without departing from the scope of the invention. For example, whilst the grain selector with a hexagonal pattern of openings has been found to provide advantageous results, it may be possible to use a selector with a square pattern of openings, provided that the size of the openings meets the requirement that they are at least as large as the primary dendrite tip radius of the metal, and smaller than half the primary dendrite arm spacing. Whilst the invention has been described in terms of producing turbine blades, the invention may be usable for producing other components.

The invention claimed is:

1. A method of growing a single crystal seed bar, the method including providing a mould with a grain selector filter above a starter chamber, filling the mould with molten metal, and allowing the metal to solidify slowly upwardly from the starter chamber, the filter having a pattern of openings, with the diameter of each of the openings being at least as large as a primary dendrite tip radius of the metal, but smaller than half a primary dendrite arm spacing.

2. A method according to claim 1, wherein the filter has a hexagonal pattern of openings.

3. A method according to claim 1, wherein the filter is less than 3 mm thick.

4. A method according to claim 1, wherein a helical pattern selector is provided beneath the grain selector filter.

5. A method according to claim 1, wherein the mould is filled at upper and lower locations.

6. A method according to claim 1, wherein the metal is a nickel based alloy.

7. A method according to claim 1, wherein the mould is heated in a furnace, and the metal is allowed to solidify by moving the mould slowly out of the furnace.

8. A method according to claim 1, wherein the mould is heated in a furnace, and the metal is allowed to solidify by moving the mould slowly out of the furnace.

9. A method according to claim 1, wherein the diameter of each of the openings in the filter is less than 150 μm.

10. A method according to claim 9, wherein the diameter of each of the openings in the filter is less than 100 μm.

11. A method according to claim 10, wherein the diameter of each of the openings in the filter is less than 50 μm.

12. A method according to claim 11, wherein the diameter of each of the openings in the filter is in the range 5-20 μm.

13. A method of casting an item, the method including providing a mould with a starter chamber and a moulding chamber of a required shape thereabove, locating a seed bar made by a method according to claim 1 in the starter chamber, heating the mould, but not so as to fully melt the seed bar, supplying molten metal into the mould and allowing the metal to solidify slowly upwardly from the seed bar.

14. A method according to claim 13, wherein a grain selector filter is provided in the mould above the starter chamber.

* * * * *